(12) United States Patent
Shu et al.

(10) Patent No.: US 10,896,853 B2
(45) Date of Patent: Jan. 19, 2021

(54) MASK-FREE METHODS OF FORMING STRUCTURES IN A SEMICONDUCTOR DEVICE

(71) Applicant: GLOBALFOUNDRIES INC., Grand Cayman (KY)

(72) Inventors: Jiehui Shu, Clifton Park, NY (US); Rinus Tek Po Lee, Ballston Lake, NY (US); Wei Hong, Clifton Park, NY (US); Hui Zang, Guilderland, NY (US); Hong Yu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/396,775

(22) Filed: Apr. 29, 2019

(65) Prior Publication Data

US 2020/0343142 A1   Oct. 29, 2020

(51) Int. Cl.
*H01L 27/088* (2006.01)
*H01L 21/8234* (2006.01)
(Continued)

(52) U.S. Cl.
CPC .......... *H01L 21/823456* (2013.01); *H01L 21/28568* (2013.01); *H01L 21/3065* (2013.01);
(Continued)

(58) Field of Classification Search
CPC ............. H01L 27/088; H01L 27/0886; H01L 27/0924; H01L 21/82345; H01L 21/823456
See application file for complete search history.

(56) References Cited

U.S. PATENT DOCUMENTS 6,586,808 B1   7/2003   Xiang et al.
6,794,234 B2   9/2004   Polishchuk et al.
(Continued)

*Primary Examiner* — Mark V Prenty
(74) *Attorney, Agent, or Firm* — David Cain

(57) ABSTRACT

The present disclosure generally relates to semiconductor device fabrication and integrated circuits. More particularly, the present disclosure relates to replacement metal gate processes and structures for transistor devices having a short channel and a long channel component. The present disclosure also relates to processes and structures for multi-gates with dissimilar threshold voltages. The present disclosure further provides a method of forming structures in a semiconductor device by forming a first and second cavities having sidewalls and bottom surfaces in a dielectric structure, where the first cavity has a narrower opening than the second cavity, forming a first material layer in the first and second cavities, forming a protective layer over the first material layer, where the protective layer fills the first cavity and conformally covers the sidewall and the bottom surfaces of the second cavity, performing a first isotropic etch on the protective layer to selectively remove a portion of the protective layer and form a retained portion of the protective layer, performing a second isotropic etch on the first material layer to selectively remove a portion of the first material layer and form a retained portion of the first material layer, removing the retained portion of the protective layer, and forming a second material layer in the first and second cavities, the second material layer being formed on the retained portion of the first material layer.

19 Claims, 15 Drawing Sheets

(51) Int. Cl.
*H01L 29/423* (2006.01)
*H01L 21/3213* (2006.01)
*H01L 21/3065* (2006.01)
*H01L 21/285* (2006.01)
*H01L 21/306* (2006.01)

(52) U.S. Cl.
CPC .. *H01L 21/30604* (2013.01); *H01L 21/32134* (2013.01); *H01L 21/32135* (2013.01); *H01L 27/088* (2013.01); *H01L 29/42372* (2013.01)

(56) References Cited

U.S. PATENT DOCUMENTS

| | | |
|---|---|---|
| 7,229,873 B2 | 6/2007 | Colombo et al. |
| 2013/0187236 A1* | 7/2013 | Xie ................. H01L 21/823842 |
| | | 257/369 |

* cited by examiner

MASK-FREE METHODS OF FORMING STRUCTURES IN A SEMICONDUCTOR DEVICE

FIELD OF THE INVENTION

The present disclosure generally relates to semiconductor device fabrication and integrated circuits. More particularly, the present disclosure relates to replacement metal gate processes and structures for transistor devices having a short channel and a long channel component. The present disclosure also relates to processes and structures for multi-gates with dissimilar threshold voltages.

BACKGROUND

The semiconductor industry's drive for higher density, higher performance, lower-cost devices and the implementation of nanometer-scale process nodes have resulted in the development of various transistor device architectures, such as three-dimensional (3D) fin-shaped field effect transistors (FinFETs), and planar transistor devices built on bulk substrates or substrates with a buried insulator layer (i.e., semiconductor-on-insulator device). In conventional transistor technologies, device architectures typically include a substrate, an active region, and a gate electrode. The active region may contain electrical input and output contacts and functions as a channel for current flow.

The gate electrode is typically placed above the channel and controls the flow of current therein. Multiple gate electrodes may also be formed over an active region to enable variability of current flow across device elements. Variability of the current flow in the channel region may be controlled by adjusting the threshold voltage property of a device. The threshold voltage may be adjusted by modifying various characteristics/features of the gate electrode and the channel beneath the gate, such as the work-function portion of a gate, the gate dielectric portion, the dopant concentration of the channel, the length of the channel, and the types of materials used in the gate electrode.

A common approach to fabricate multiple gate electrodes that provide different threshold voltages in a device is to utilize photolithographic technologies and masks, including reticle masks, optical masks and photolithographic masks. These masks enable the creation of various patterns over a substrate, which in turn enables the modification of desired features in a gate electrode (e.g., the thicknesses/material composition of the work-function portion in a gate), thereby allowing adjustments to the threshold voltage property of the device. However, the use of masks and the associated photolithographic tools incur significantly large monetary costs and are undesirable in a competitive business environment.

Therefore, there is a need to provide methods of forming a semiconductor structure that can overcome, or at least ameliorate, one or more of the disadvantages as described above.

SUMMARY

In one aspect of the present disclosure, there is provided a method of forming structures in a semiconductor device by forming first and second cavities having sidewalls and bottom surfaces in a dielectric structure, where the first cavity has a narrower opening than the second cavity, forming a first material layer in the first and second cavities, forming a protective layer over the first material layer, where the protective layer fills the first cavity and conformally covers the sidewall and the bottom surfaces of the second cavity, performing a first isotropic etch on the protective layer to selectively remove a portion of the protective layer and form a retained portion of the protective layer, performing a second isotropic etch on the first material layer to selectively remove a portion of the first material layer and form a retained portion of the first material layer, removing the retained portion of the protective layer, and forming a second material layer in the first and second cavities, the second material layer being formed on the retained portion of the first material layer.

In another aspect of the present disclosure, there is provided a method of forming gate structures in a semiconductor device by forming first and second gate cavities having sidewall surfaces and bottom surfaces, the first and second gate cavities being formed above an active region and separated by a dielectric structure, where the first gate cavity has a shorter channel length than the second gate cavity, forming a first work-function material (WFM) layer in the first and second gate cavities, forming a protective layer over the first WFM layer, where the protective layer fills the first gate cavity and conformally covers the sidewall and the bottom surfaces of the second gate cavity, performing a first isotropic etch on the protective layer to selectively remove a portion of the protective layer and form a retained portion of the protective layer, performing a second isotropic etch on the first WFM layer to selectively remove a portion of the first WFM layer and form a retained portion of the first WFM layer, removing the retained portion of the protective layer, and forming a second WFM layer in the first and second cavities, the second WFM layer being formed on the retained portion of the first WFM layer.

In yet another aspect of the present disclosure, there is provided a semiconductor device including first and second structures separated by a dielectric structure formed above an active region, the first and second structures having sidewall and bottom surfaces, where the bottom surface of the first structure is smaller than the bottom surface of the second structure, a dielectric layer disposed on the sidewall and the bottom surfaces of the first and second structures, and a work-function material (WFM) layer disposed on the dielectric layers in either the first structure or the second structure.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
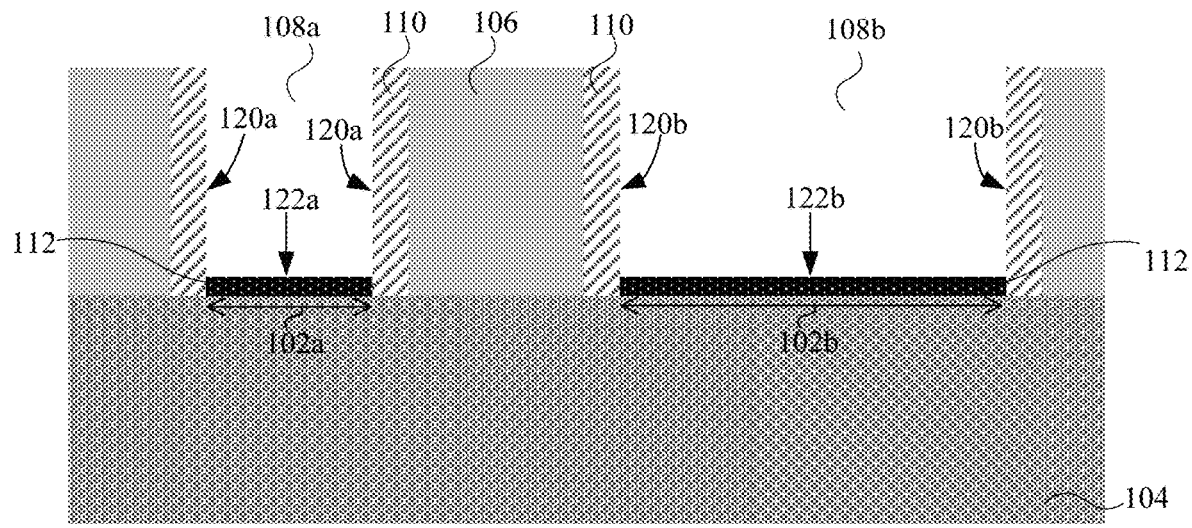
FIGS. 1A and 1B are cross-sectional and plan views, respectively, of a set of device features for forming structures in a semiconductor device in accordance with embodiments of the present disclosure.
Figure 1B:
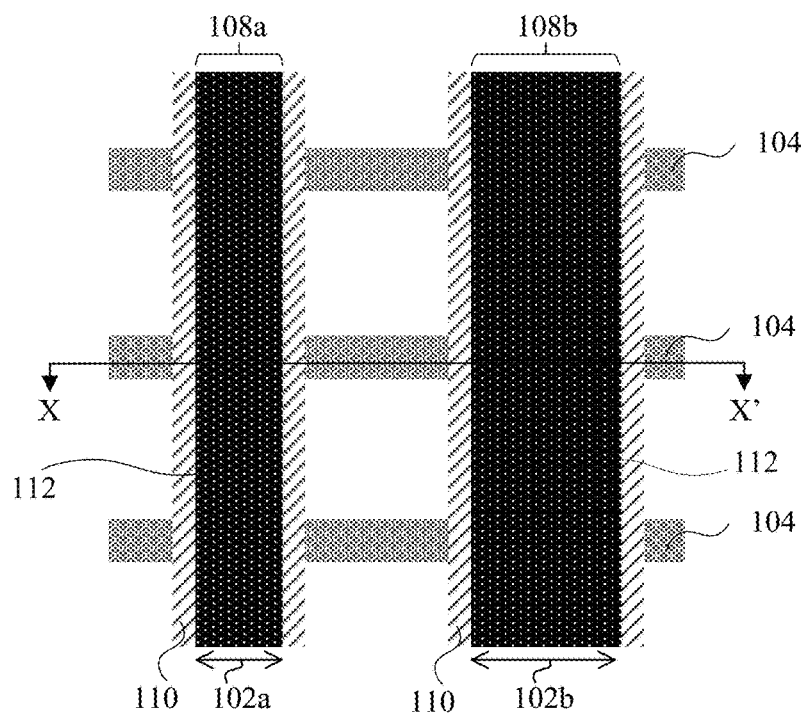

Referring to FIGS. 1A and 1B, a cross-sectional view and a plan view, respectively, show a set of device features for forming a semiconductor structure in accordance with the present disclosure. The device features may include a substrate (not shown in the accompanying drawings), an active region 104 (e.g., a fin) formed on the substrate, and first and second cavities (108a and 108b, respectively) disposed above and extending laterally across the active region 104. In some embodiments (not shown), the active region 104 includes a channel region flanked by a source contact and a drain contact. The device features may be formed by conventional semiconductor fabrication processes.

The first and second cavities (108a and 108b, respectively) may be used for device features that are formed at various fabrication stages (e.g., front-end of line, middle-end of line, or back-end of line processes). For example, the first and second cavities (108a and 108b, respectively) may be device features such as interconnect via openings, gate cut trenches, or gate cavities. In one embodiment, the first and second cavities (108a and 108b, respectively) are gate cavities formed after the removal of dummy gate electrodes during replacement metal gate processes.

Referring to FIG. 1A, the first and second cavities (108a and 108b, respectively) may be separated or electrically isolated from each other by a dielectric structure 106. The dielectric structure 106 may include a dielectric compound, such as silicon nitride (SiN), or silicon dioxide ($SiO_2$). Additionally, the first and second cavities (108a and 108b, respectively) may be flanked by sidewall spacer structures 110, and an interfacial dielectric layer 112 (e.g., silicon dioxide ($SiO_2$)) is formed at the bottom of the cavities. As shown in FIG. 1A, the lined first and second cavities (108a and 108b, respectively) have sidewall surfaces 120a and 120b, and bottom surfaces 122a and 122b. In some embodiments, the bottom surface 122a of the first cavity 108a is smaller than the bottom surface 122b of the second cavity 108b.

The sidewall spacer structures 110 may function as a gate spacer to prevent an electrical short between the gate electrode and the source/drain regions in the active region 104. The sidewall spacer structures 110 may include a low-K dielectric material. The term "low-K" as used herein refers to a material having a dielectric constant (i.e., K value) that is lower than 7. Exemplary low-K dielectric material may include, but not limited to, silicon dioxide ($SiO_2$), silicon oxide materials enriched or doped with atomic elements selected from the group consisting of carbon, boron, hydrogen and nitrogen (e.g., SiOCN, SiBCN), silicon oxynitride (SiON), SiGe oxide, germanium oxide, silicon oxycarbide, SiCOH dielectrics, or any combination thereof.

In some embodiments, the first cavity 108a has a width dimension 102a in the range of about 16 nm to about 30 nm, while the second cavity 108b has a width dimension 102b in the range of about 30 nm to about 300 nm. The width 102a of the first cavity 108a may be smaller than the width 102b of the second cavity 108b. In particular, the first cavity width 102a and the second cavity width 102b differ from each other in the range of about 40 nm to about 280 nm. In another embodiment, the width dimensions 102a and 102b correspond to the lengths of the channels below gate electrodes. In particular, the first gate cavity 108a has a shorter channel length than the second gate cavity 108b.

FIG. 1B shows the plan view for the set of device features depicted in FIG. 1A. The line X-X' indicates the position of a section line for the cross-sectional view shown in FIG. 1A. For clarity's sake, the dielectric structure 106 is omitted so as not to obscure the illustration of active regions 104 positioned underneath.

While the active region 104 is represented as a fin in the accompanying drawings, it should be noted that the fin is used only as a non-limiting example of the active region 104, and other active regions (e.g., a doped layer on a top surface of a bulk semiconductor substrate or a semiconductor-on-insulator layer) may be used as well. It should also be understood that the present disclosure can be applied to any type of transistor device architecture, such as a three-dimensional device architecture (e.g., FinFETs), or a planar device architecture (e.g., complementary metal oxide semiconductor (CMOS) devices), semiconductor-on-insulator (SOI) devices).

In addition, the active region 104 may be made of any suitable semiconductor material, such as silicon, germanium, or silicon germanium. Although not shown in the accompanying drawings, the substrate may be made of any suitable semiconductor material, such as silicon (Si), germanium (Ge), silicon germanium (SiGe), silicon/carbon, other II-VI or III-V semiconductor compounds and the like. The substrate may also include an organic semiconductor or a layered semiconductor, such as Si/SiGe, a silicon-on-insulator or a SiGe-on-insulator.

Figure 2:
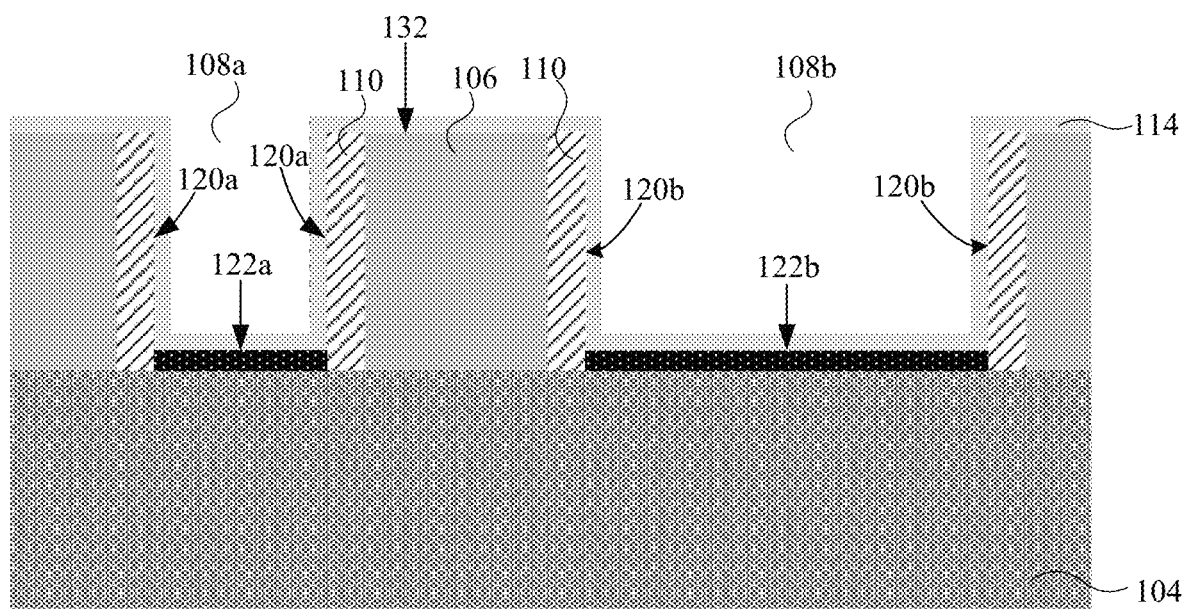
FIGS. 2 to 4 are cross-sectional views depicting successive stages of forming structures in a semiconductor device in accordance with embodiments of the present disclosure.

Referring to FIG. 2 (FIG. 2 continues from FIG. 1A), a dielectric layer 114 is formed in the first and second cavities (108a and 108b, respectively). The dielectric layer 114 may be formed by conventional deposition processes, such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. However, a highly conformal deposition process is preferred for depositing the dielectric layer 114; for example, an ALD process or a highly-controlled CVD process. As shown in FIG. 2, the dielectric layer 114 is deposited on and conforming to the sidewall surfaces 120a and 120b and the bottom surfaces 122a and 122b. In addition, the dielectric layer 114 is formed on a top surface 132 of the dielectric structure 106.

In one embodiment, the dielectric layer 114 is a gate dielectric layer having a high-K dielectric material. The term "high-K" as used herein refers to a material having a dielectric constant (i.e., K value) that is greater than 7. The high-K dielectric material may include, but not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride (La$_2$O$_x$N$_y$), aluminum oxynitride (Al$_2$O$_x$N$_y$), titanium oxynitride (TiO$_x$N$_y$), strontium titanium oxynitride (SrTiO$_x$N$_y$), lanthanum aluminum oxynitride (LaAlO$_x$N$_y$), yttrium oxynitride (Y$_2$O$_x$N$_y$), a silicate thereof, and an alloy thereof. Each value of x is independently from 0.5 to 3 and each value of y is independently from 0 to 2. The gate dielectric layer 114 may have a thickness in the range of about 0.9 nm to about 6 nm, and preferably about 1.0 nm to about 3 nm.

Figure 3:
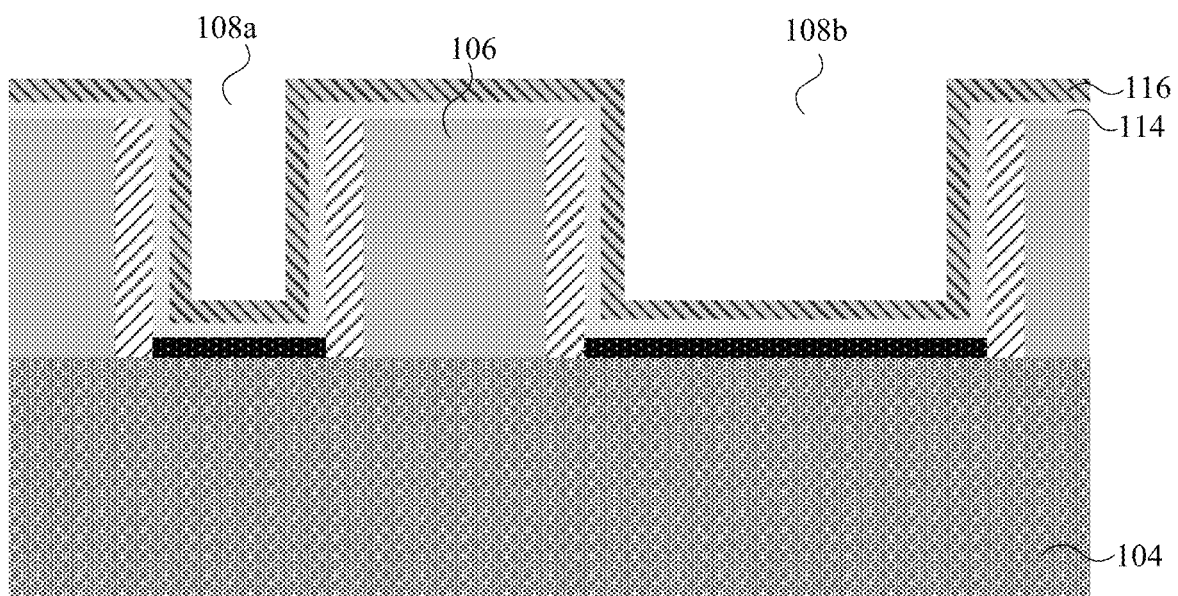

Referring to FIG. 3, a first material layer 116 is formed in the first and second cavities (108a and 108b, respectively). The first material layer 116 may be formed by conventional deposition processes; however, a highly conformal process (e.g., ALD process or highly-controlled CVD process) is preferred. As shown in FIG. 3, the first material layer 116 is conformally deposited on the dielectric layer 114.

In one embodiment, the first material layer 116 is a first work-function material (WFM) layer. The WFM layer may include any metallic compound or a composition of metallic compounds capable of modifying the work function property of a gate electrode. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof. In particular, the first WFM layer 116 is preferably a titanium nitride layer. The first WFM layer 116 may have a thickness in the range of about 0.5 nm to about 5 nm.

Figure 4:
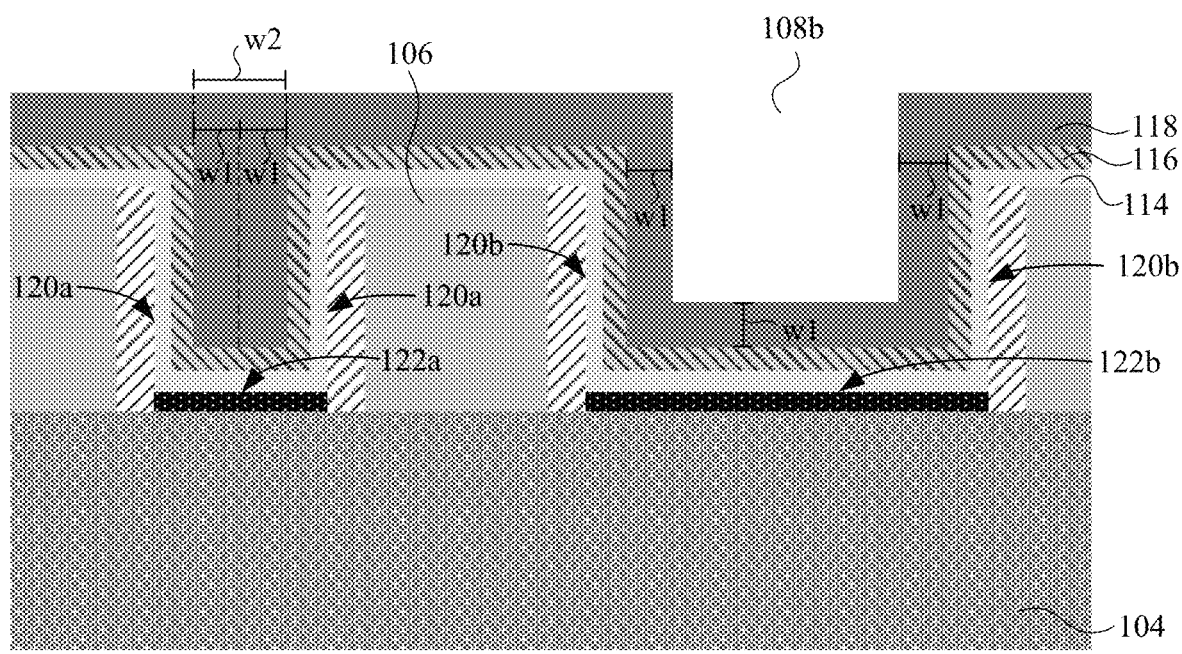

Referring to FIG. 4, a protective layer 118 is formed in the first and second cavities (108a and 108b, respectively). For example, the protective layer 118 is formed on the first material layer 116 and fills up the first cavity 108a and, simultaneously, the protective layer 118 is formed to conform to the first material layer 116 of the second cavity 108b. Due to the differences in the size of the cavities, the second cavity 108b is only partially filled. In one embodiment, the protective layer 118 includes amorphous silicon.

While conventional deposition processes can be used to form the protective layer 118, a highly conformal deposition process (e.g., ALD process or highly-controlled CVD process) is preferred. The conformal deposition process may be terminated once the first cavity 108a is filled, i.e., the protective layer 118 "pinches-off" the opening of the first cavity 108a. Ideally, the first cavity 108a should be completely filled (i.e., no voids or air pockets), however, in practice, an infinitesimal void (not shown in the accompanying drawings) may occur within the first cavity 108a due to process variability in the deposition of the protective layer 118.

To fill the first cavity 108a, the thickness w1 of the protective layer 118 deposited on the first material layer 116 increases laterally from the first material layer 116 (i.e., the directional increase of the thickness w1 extends along a direction vector laterally away from the first material layer 116) such that the portions of the protective layer 118 deposited over the sidewalls 120a of the first cavity 108a make contact at the mid-point. Accordingly, the thickness w2 of the protective layer 118 within the first cavity 108a is twice the thickness w1 of the protective layer 118 formed within the second cavity 108b, as shown in FIG. 4. Advantageously, the conformal deposition process enables the protective layer 118 to fill up the first cavity 108a while simultaneously forming a conformal protective layer 118 in the second cavity 108b (i.e., not completely filling the second cavity 108b).

Figure 5:
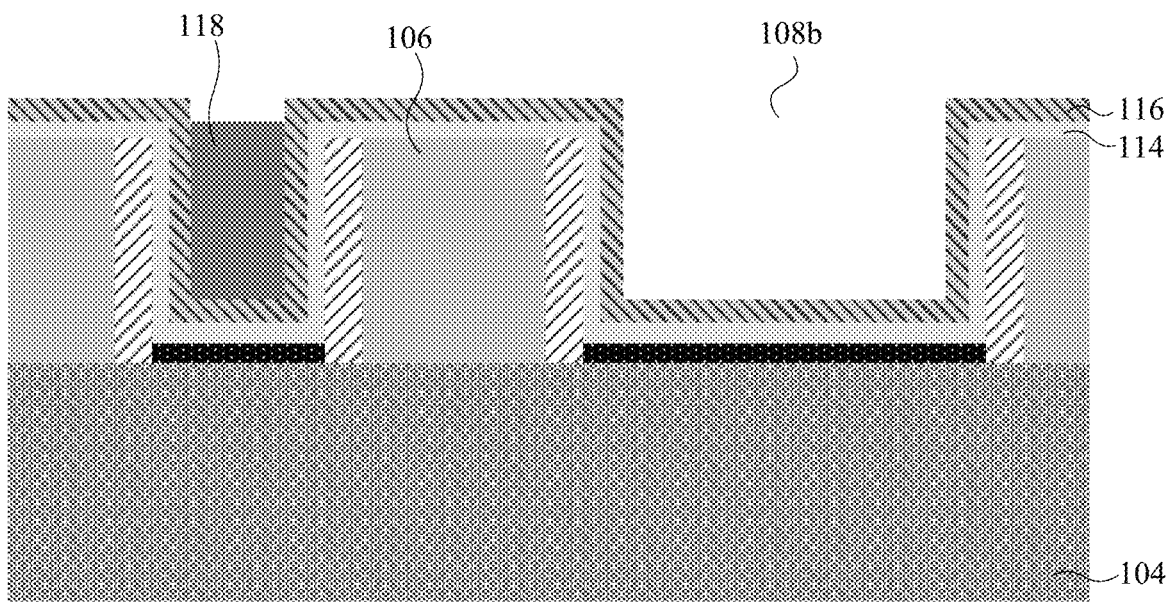
FIGS. 5 to 8 are cross-sectional views depicting, in successive stages, an exemplary set of diagrams for forming structures in a semiconductor device in accordance with embodiments of the present disclosure.

Referring to FIG. 5, a first isotropic etch is performed on the protective layer 118 to selectively remove a portion of the protective layer 118 from the second cavity 108b and form a retained portion of the protective layer 118 in the first cavity 108a. The removal of the protective layer 118 is carried out by selective etching. The first isotropic etch may be a wet etch process or a dry etch process, and may be controlled by a predetermined time. As shown in FIG. 5, the removal of the protective layer 118 from the second cavity 108b exposes the underlying first material layer 116, and only the portion of the protective layer 118 within the first cavity 108a remains. Also shown in FIG. 5, the protective layer 118 may be etched below the first material layer 116.

The term "selective etching" as used herein means a chemical etch technique which can selectively eliminate the targeted layer without etching the layer beneath the targeted layer (i.e., the "stop" layer), by adjusting the composition of the etchant, and as a result, controlling the relative etching rates between the targeted layer and the "stop" layer.

Figure 6:
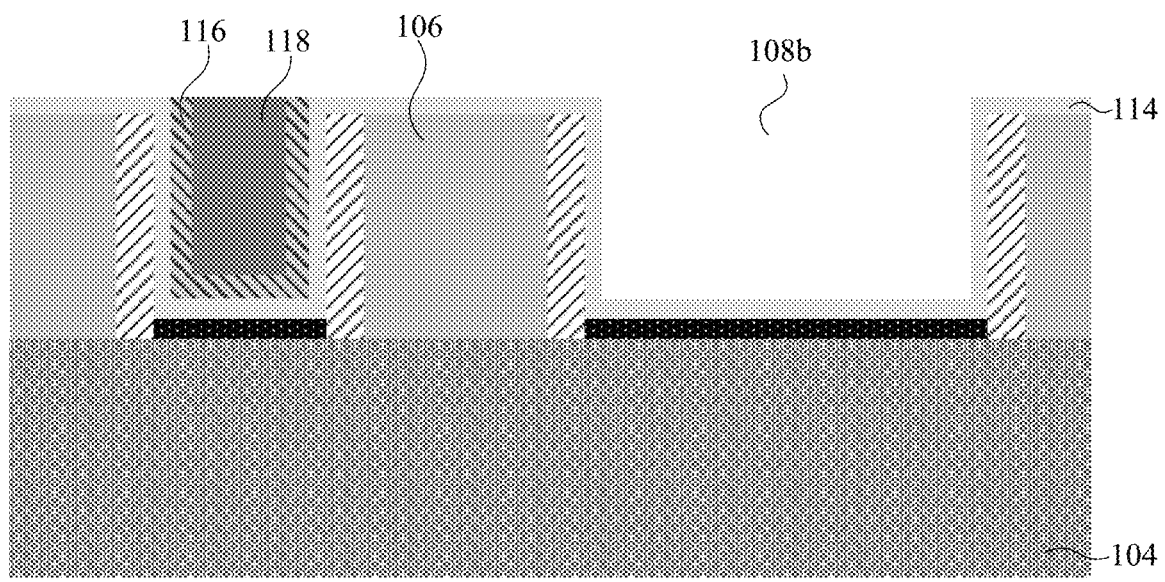

Referring to FIG. 6, a second isotropic etch is performed on the first material layer 116 to selectively remove the first material layer 116 from the second cavity 108b and form a retained portion of the first material layer 116 in the first cavity 108a. The removal of the first material layer 116 is carried out by selective etching as described above. The second isotropic etching may be a wet etch process or a dry etch process, and may be controlled by a predetermined time. As shown in FIG. 6, the removal of the first material layer 116 from the second cavity 108b exposes the underlying dielectric layer 114.

Figure 7:
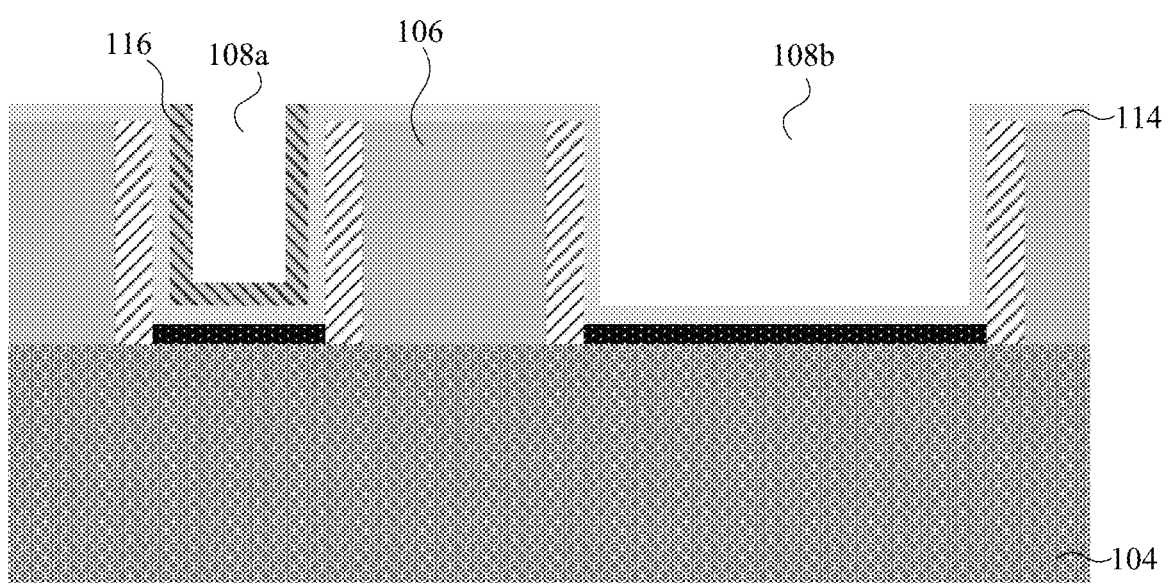

Referring to FIG. 7, the retained portion of the protective layer 118 in the first cavity 108a is removed. The removal of the remaining portion of the protective layer 118 is carried out by selective etching as described above and may be performed by a wet etch or a dry etch process controlled by a predetermined time. As shown in FIG. 7, the removal of the remaining portion of the protective layer 118 exposes the underlying first material layer 116 within the first cavity 108a.

Figure 8:
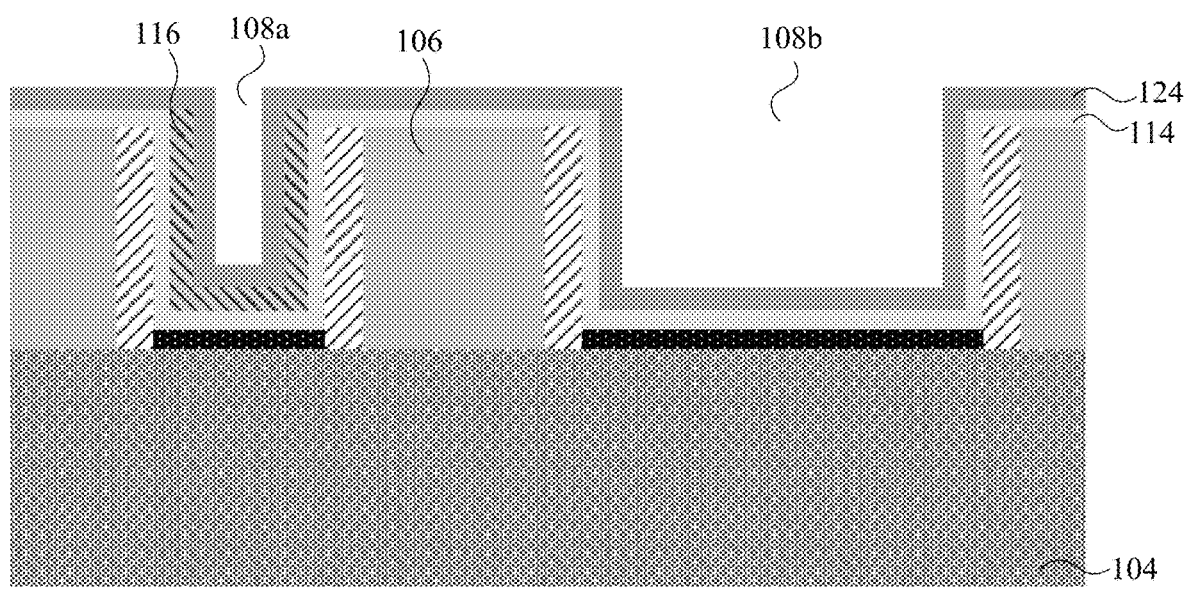

Referring to FIG. 8, a second material layer 124 is formed in the first and second cavities (108a and 108b, respectively). The second material layer 124 may be formed by conventional deposition processes; however, a highly conformal process (e.g., ALD process or highly-controlled CVD process) is preferred. As shown in FIG. 8, the second material layer 124 is deposited over the entire top surface of the set of device features in FIG. 7, including the first and second cavities (108a and 108b, respectively). The second material layer 124 may be formed by conventional deposition processes; however, a highly conformal process (e.g., ALD process or highly-controlled CVD process) is preferred. For example, the second material layer 124 is formed on the portion of the dielectric layer 114 that overlies the dielectric structure 106, and is also formed on the retained first material layer 116 in the first cavity 108a.

In one embodiment, the second material layer 124 is a second WFM layer and may include any metallic compound or a composition of metallic compounds capable of modifying the work function property of a gate electrode, as described in FIG. 3. The second WFM layer 124 may have the same or different compound as the first WFM layer 116. In addition, the second WFM layer 124 may have the same or different thickness as the first WFM layer 116. In particular, the second WFM layer 124 may have a thickness in the range of about 0.5 nm to about 10 nm. In another embodiment, the second WFM layer 124 is a titanium nitride layer.

Figure 9:
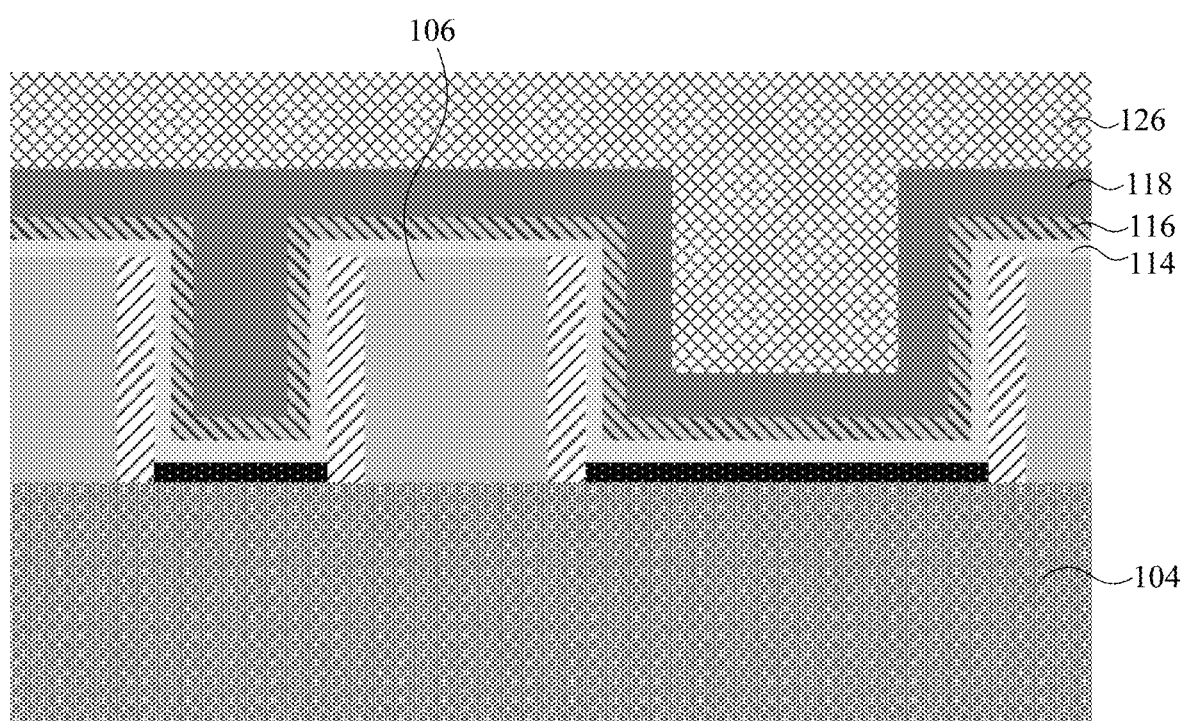
FIGS. 9 to 15 are cross-sectional views depicting, in successive stages, another exemplary set of diagrams for forming structures in a semiconductor device in accordance with embodiments of the present disclosure.

Referring to FIG. 9, the embodiment shown in FIG. 4 is used, and a sacrificial block layer 126 is formed to cover the protective layer 118, including within the second cavity 108b. The sacrificial block layer 126 may be formed by a conventional deposition process, such as spin-on coating or CVD. In one embodiment, the sacrificial block layer 126 is a spin-on carbon material. The spin-on carbon material may include a polymeric compound containing atoms selected from the group consisting of carbon, hydrogen, oxygen, and nitrogen.

Figure 10:
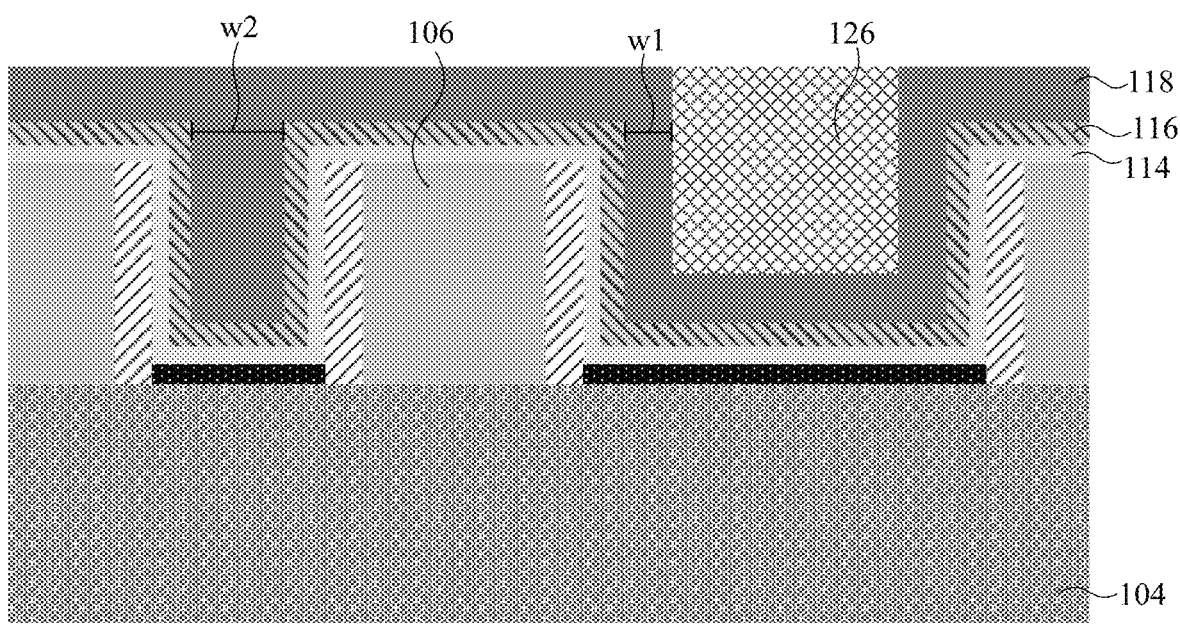

As shown in FIG. 10, the sacrificial block layer 126 is subsequently removed by a planarization process (e.g., chemical mechanical planarization (CMP)) or a selective etching process such that the sacrificial block layer 126 is retained only in the second cavity 108b. The protective layer 118 within the first cavity 108a has a thickness w2, while the protective layer 118 within the second cavity 108b has a thickness w1.

Figure 11:
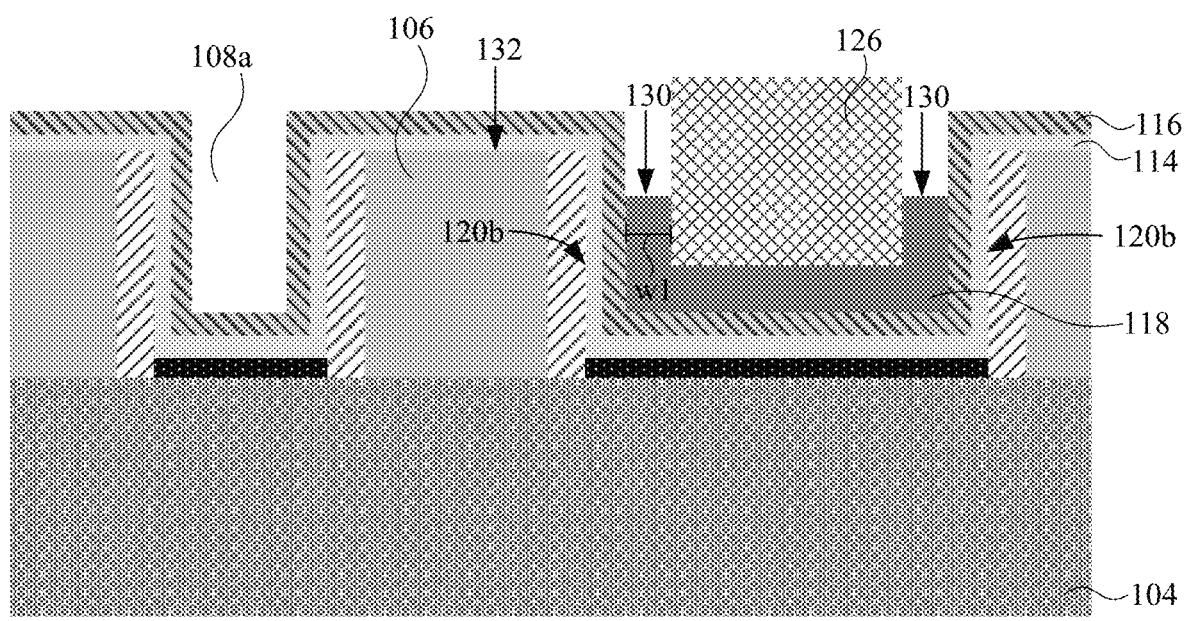

Referring to FIG. 11, a first isotropic etch is performed on the protective layer 118 to selectively remove the protective layer 118 from the first cavity 108a and retain the protective layer 118 in the second cavity 108b. The first isotropic etching may be a wet etch process or a dry etch process, and may be controlled by a predetermined time. The removal of the protective layer 118 from the first cavity 108a exposes the underlying first material layer 116, while the protective layer 118 retained in the second cavity 108b is etched below the top surface 132 of the dielectric structure 106.

Due to the difference in the thickness w2 of the protective layer 118 within the first cavity 108a and the thickness w1 of the protective layer 118 within the second cavity 108b, the vertical etch rate of the protective layer 118 in the first cavity 108a is faster than the vertical etch rate of the protective layer 118 in the second cavity 108b. Accordingly, the retained portion of the protective layer 118 in the second cavity 108b has top edges 130 that are formed simultaneously with the removal of the portion of the protective layer 118 from the first cavity 108a. In this embodiment, the top edges 130 are etched below the top surface 132 of the dielectric structure 106.

Advantageously, the presence of the sacrificial block layer 126 in the second cavity 108b ensures that only portions of the protective layer 118 deposited over the sidewall surfaces 120b of the second cavity 108b are removed during the first isotropic etch.

Figure 12:
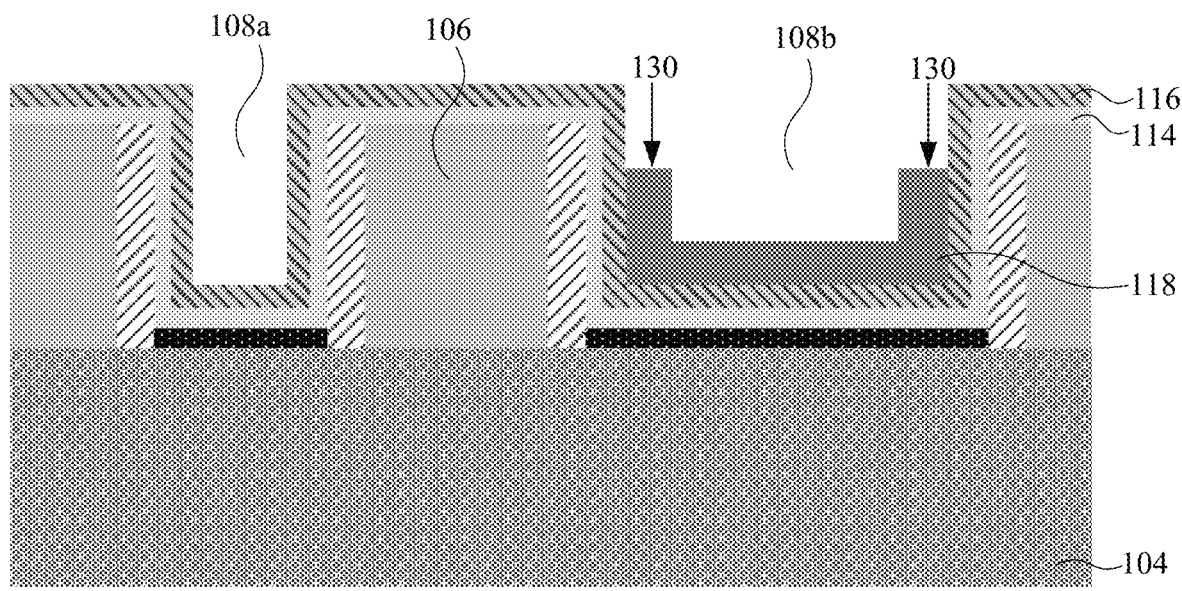

Referring to FIG. 12, the sacrificial block layer 126 is selectively and completely removed from the second cavity 108b and exposes the protective layer 118. The sacrificial block layer 126 may be removed using an isotropic etching process (e.g., a wet etch).

Figure 13:
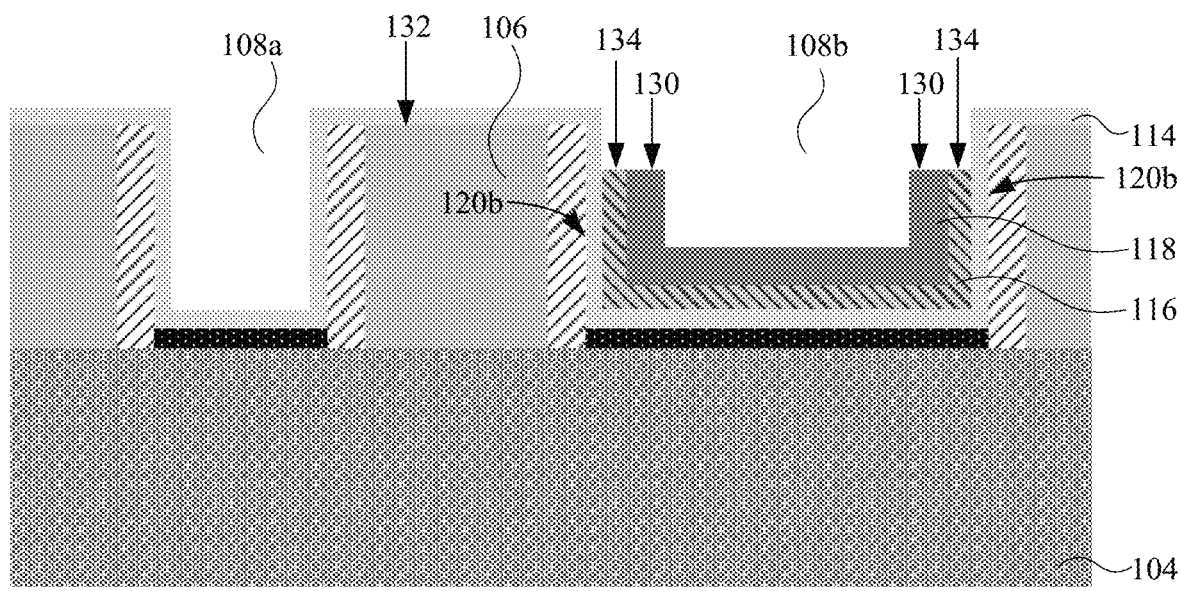

Referring to FIG. 13, a second isotropic etch is performed on the first material layer 116 to selectively remove first material layer 116 from the first cavity 108a and retain a portion of the first material layer 116 in the second cavity 108b. The second isotropic etching may be a wet etch process or a dry etch process, and may be controlled by a predetermined time. The removal of the first material layer 116 from the first cavity 108a exposes the underlying dielectric layer 114. In particular, the retained portion of the first material layer 116 in the second cavity 108b has top edges 134 that are formed simultaneously with the removal of the portion of the protective layer 118 from the first cavity 108a. In this embodiment, the first material layer 116 extends over only a portion of the dielectric layer 114 on the sidewall surfaces 120b of the second cavity 108b. Additionally, the top edges 134 of the first material layer 116 are etched below the top surface 132 of the dielectric structure 106.

Figure 14:
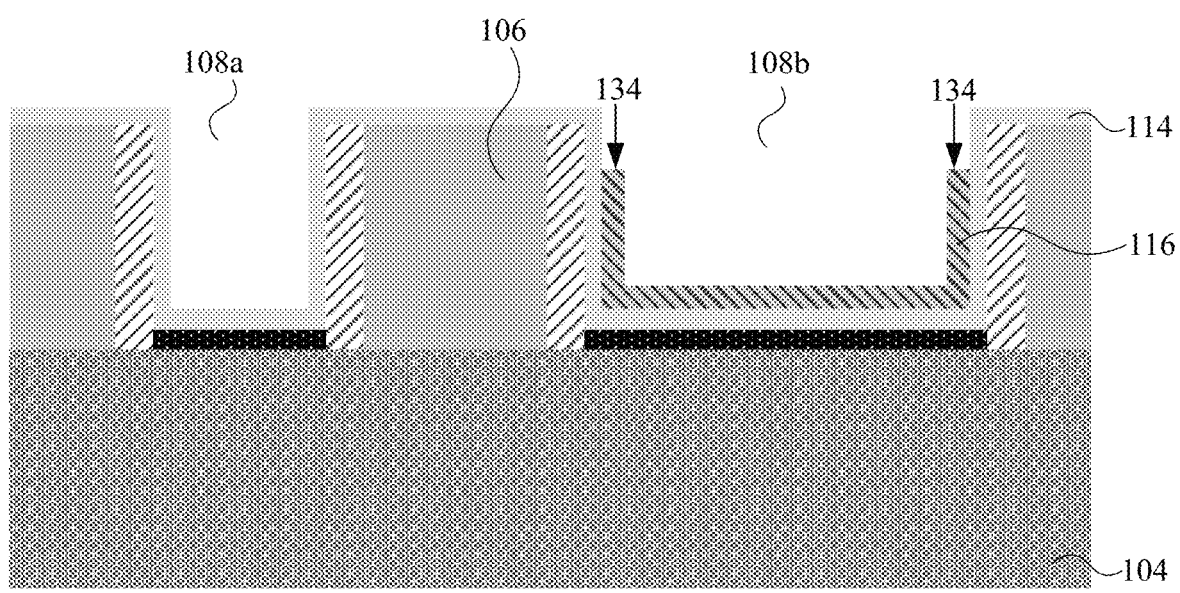

Referring to FIG. 14, the retained portion of the protective layer 118 in the second cavity 108b is removed, in the same manner described in FIG. 7. The removal of the retained portion of the protective layer 118 exposes the underlying first material layer 116 within the second cavity 108b.

Figure 15:
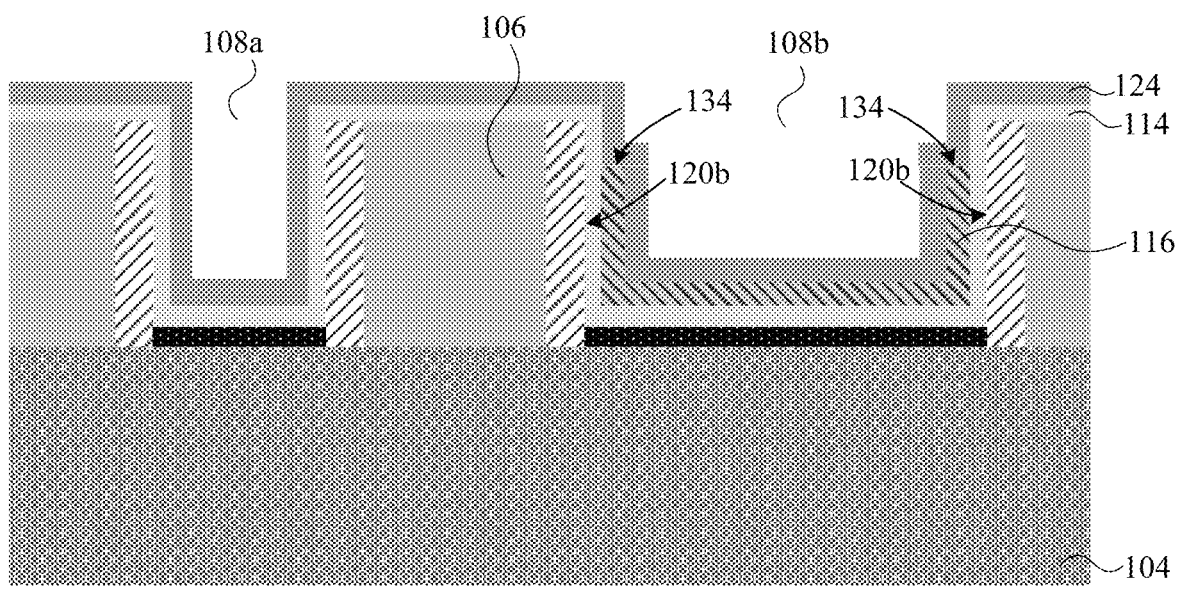

Referring to FIG. 15, a second material layer 124 is deposited over the surface of the device structure, including the first and second cavities (108a and 108b, respectively). The second material layer 124 may be formed by conventional deposition processes; however, a highly conformal process (e.g., ALD process or highly-controlled CVD process) is preferred. In this embodiment, as shown in FIG. 15, the second material layer 124 conformally covers the top edges 134 of the first material layer 116 creating a step on each side of the second cavity 108b.

Advantageously, the protective layer 118 provides etch protection for the covered portion of the first material layer 116 in the first cavity 108a while allowing the uncovered portion of the first material layer 116 in the second cavity 108b to be removed, and vice versa. In particular, the presence of the protective layer 118 is found to enable selective retention of the first material layer 116 in either the first cavity 108a or the second cavity 108b after the second isotropic etch. More advantageously, the present method does not use additional photolithography mask to enable partial removal of the protective layer 118 and the first material layer 116 described herein.

In embodiments of the present disclosure, the first and second material layers (116 and 124, respectively) are first and second WFM layers, respectively, and constitutes the work-function component of a gate electrode. As described herein, the first and second WFM layers (116 and 124, respectively) may be of the same or different material compositions, and may also have the same or different thicknesses with respect to each other.

As a non-limiting example, the work function component in the first gate cavity 108a includes both first and second WFM layers (116 and 124, respectively) while the work function component in the second gate cavity 108b includes only the second WFM layer 124. The first and second WFM layers (116 and 124, respectively) in the first gate cavity 108a are formed using the same compound. In this example, the work function component in the first gate cavity 108a is modified to be thicker than the work function component in the second gate cavity 108b. Accordingly, the threshold voltage of the first gate cavity 108a is found to be lower than the threshold voltage of the second gate cavity 108b.

Alternatively, the first and second WFM layers (116 and 124, respectively) in the first gate cavity 108a are formed using different compounds, while the second cavity 108b includes only the second WFM layer 124. Accordingly, the threshold voltage of the first gate cavity 108a is found to be lower than the threshold voltage of the second gate cavity 108b.

Advantageously, the present method is found to enable the fabrication of multiple gate electrodes having dissimilar thicknesses/material compositions of the work function component without having to use a photolithography mask (e.g., a reticle mask), thereby significantly reducing the fabrication cost of the semiconductor device. More advantageously, the present method is found to enable the formation of multiple gate electrodes having different threshold voltage properties in the semiconductor device.

Throughout this disclosure, the terms top, upper, upwards, over, and above refer to the direction away from the active region. Likewise, the terms bottom, lower, downwards, under, and below refer to the direction towards the active region. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in replacement metal gate processes for forming gate electrode components on a semiconductor device, and may be employed in manufacturing a variety of different integrated circuit products, including, but not limited to, logic products, memory products, 3D transistor devices, FinFET transistor devices, planar transistor devices, CMOS devices, SOI devices etc.

What is claimed is:

1. A semiconductor device comprising:
   first and second structures separated by a dielectric structure formed above an active region,
   the first and second structures having sidewall and bottom surfaces, wherein the bottom surface of the first structure is smaller than the bottom surface of the second structure;
   a dielectric layer disposed on the sidewall and the bottom surfaces of the first and second structures;
   a first work-function material (WFM) layer disposed on the dielectric layer in the first structure; and
   a second WFM layer disposed on the first WFM layer in the first structure, wherein the second WFM layer is also disposed on the dielectric layer in the second structure.

2. The semiconductor device of claim 1, wherein the first and second WFM layers are of different material compositions.

3. The semiconductor device of claim 2, wherein the first and second WFM layers are of different thicknesses.

4. The semiconductor device of claim 2, wherein the first and second WFM layers are of the same thickness.

5. The semiconductor device of claim 1, wherein the first and second WFM layers in the first structure are of the same material and constitute a work function component of the first structure, and wherein the second WFM layer in the second structure constitute a work function component of the second structure.

6. The semiconductor device of claim 5, wherein the work function component of the first structure has a larger thickness than the work function component of the second structure.

7. A semiconductor device comprising:
   first and second structures separated by a dielectric structure formed above an active region,
   the first and second structures having sidewall and bottom surfaces, wherein the bottom surface of the first structure is smaller than the bottom surface of the second structure;
   a dielectric layer disposed on the sidewall and the bottom surfaces of the first and second structures;
   a first work-function material (WFM) layer disposed on the dielectric layer in the second structure; and
   a second WFM layer disposed on the first WFM layer in the second structure, wherein the second WFM layer is also disposed on the dielectric layer in the first structure.

8. The semiconductor device of claim 7, wherein the first WFM layer disposed on the dielectric layer in the second structure extends over only a portion of the dielectric layer on the sidewall surfaces of the second structure and at a level below a top surface of the dielectric structure.

9. The semiconductor device of claim 7, wherein the first and second WFM layers are of different material compositions.

10. The semiconductor device of claim 9, wherein the first and second WFM layers are of different thicknesses.

11. The semiconductor device of claim 9, wherein the first and second WFM layers are of the same thickness.

12. The semiconductor device of claim 7, wherein the first and second WFM layers in the first structure are of the same material and constitute a work function component of the first structure, and wherein the second WFM layer in the second structure constitute a work function component of the second structure.

13. The semiconductor device of claim 12 wherein the work function component of the first structure has a larger thickness than the work function component of the second structure.

14. The semiconductor device of claim 3, wherein the first and second WFM layers in the first structure constitute a work function component of the first structure, and wherein the second WFM layer in the second structure constitute a work function component of the second structure.

15. The semiconductor device of claim 14, wherein the first WFM layer includes titanium nitride.

16. The semiconductor device of claim 6, wherein the first WFM layer has a thickness in the range of 0.5 nm to 5 nm and the second WFM layer has a thickness in the range of 0.5 to 10 nm.

17. The semiconductor device of claim 10, wherein the first and second WFM layers in the second structure constitute a work function component of the second structure, and wherein the second WFM layer in the first structure constitute a work function component of the first structure.

18. The semiconductor device of claim 17, wherein the first WFM layer includes titanium nitride.

19. The semiconductor device of claim 13, wherein the first WFM layer has a thickness in the range of 0.5 nm to 5 nm and the second WFM layer has a thickness in the range of 0.5 to 10 nm.

* * * * *